United States Patent [19]

Kroner

[11] 4,023,052
[45] May 10, 1977

[54] TOUCH CONTROL ARRANGEMENT
[75] Inventor: Klaus Kroner, Hamburg, Germany
[73] Assignee: U.S. Philips Corporation, New York, N.Y.
[22] Filed: Sept. 9, 1974
[21] Appl. No.: 504,187
[30] Foreign Application Priority Data
Sept. 8, 1973 Germany .................... 2345438
Sept. 8, 1973 Germany .................... 2345495
[52] U.S. Cl. .................... 307/308; 307/229; 328/5; 340/258 C
[51] Int. Cl.² .................... H03K 27/00; H03J 1/00
[58] Field of Search .................... 307/308; 328/5; 340/258 C; 331/65

[56] References Cited
UNITED STATES PATENTS

| 3,112,476 | 11/1963 | Cohler et al. ............... 328/5 |
| 3,509,367 | 4/1970 | Orsen ......................... 328/183 |
| 3,530,310 | 9/1970 | Adelson et al. ............. 328/5 |
| 3,736,445 | 5/1973 | Sickle ......................... 328/5 |
| 3,872,328 | 3/1975 | Hulbosch et al. .......... 307/308 |

Primary Examiner—Stanley D. Miller, Jr.
Assistant Examiner—B. P. Davis
Attorney, Agent, or Firm—Frank R. Trifari; Henry I. Steckler

[57] ABSTRACT

A great limitation of the tolerance in the touch sensitivity is obtained by a special touch control arrangement.

4 Claims, 2 Drawing Figures

TOUCH CONTROL ARRANGEMENT

The invention relates to a touch control arrangement comprising at least one touch contact coupled to an input of an amplifier.

In modern operating devices particularly for television receivers the conventional push buttons used to simplify operations for, for example, programme switching have been abolished and replaced by touch contacts with which electrical switching actions are performed. With such touch contacts the switching actions are mainly caused by touch-control amplifiers coupled to the contacts. These amplifiers can control, for example, stores which in turn control programme change-over switches.

Touch-control amplifiers in known circuit arrangements have a number of transistors arranged one after the other (see also the German published Patent Application No. 1,932,531). The sensitivity of conventional circuit arrangements is dependent on the product of the current amplification factors of these transistors. These amplification factors may have a large mutual spread. Input currents were necessary for a conventional touch control circuit which had a ratio of 1:20 relative to each other to cause one and the same switching action. For a minimum input sensitivity of 1 $\mu A$ the maximum input sensitivity then is 50 nA, i.e. at a voltage of, for example, 10V fingertip-resistances of from 10 MOhm to 200 MOhm are required for the conventional circuit. A value of 10 MOhm is actually too low because on the basis of, for example, the VDE prescriptions safety resistors must be arranged before the touch contacts, whereas a value of 200 MOhm is too large to expect a satisfactory operation in case of a high degree of humidity.

It is an object of the invention to limit the influence of the tolerance of the input sensitivity of the amplifiers on the contact sensitivity. A switching action must be performed, for example, when the resistance between the electrodes of the touch-control contacts is between 25 and 50 MOhm so that the difference in sensitivity of the circuit arrangement is to be limited to substantially 1:2.

According to the invention this problem is solved by a touch control circuit arrangement of the type described in the preamble which is characterized in that a touch electrode of the touch contact is coupled to the collector of a transistor arranged as a current source and to the input of the corresponding amplifier, while another touch electrode is coupled to a reference voltage.

This special arrangement of the touch controls provides a considerable limitation of the influence of said tolerances.

The invention will now be described in greater detail with reference to the drawing.

Figure 1:
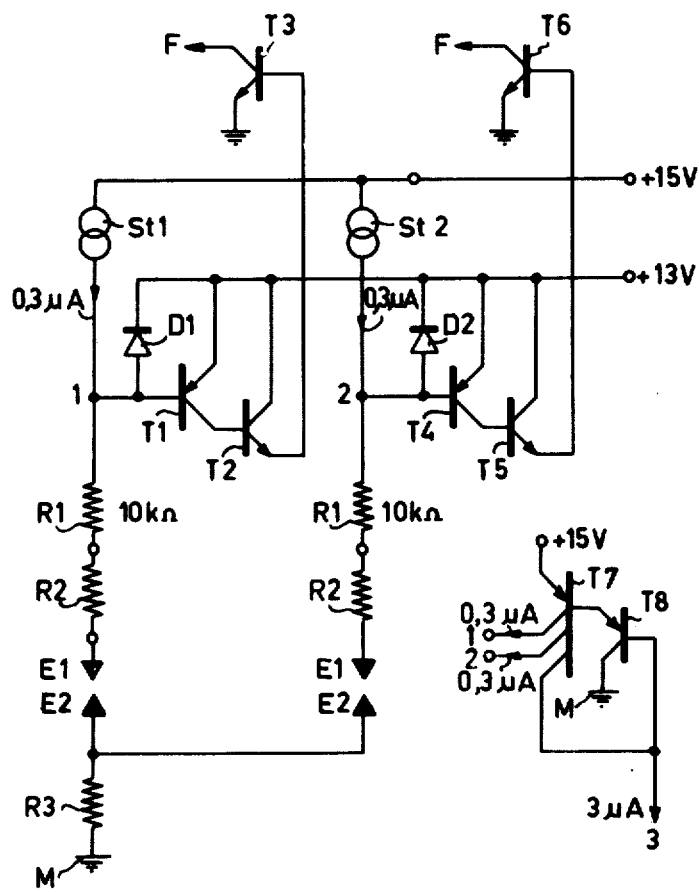
FIG. 1 shows a touch control arrangement according to the invention.

FIG. 1 shows part of a so-called IC or integrated circuit. Two touch-control amplifiers are shown one of which comprises two transistors $T_1$ and $T_2$ and a transistor $T_3$ arranged thereafter and operating as an amplifier which transistor also serves as a switch and controls a flipflop connected at F which is incorporated in the input of a storage circuit. A second touch-control amplifier consists of the transistors $T_4$ and $T_5$ with a transistor $T_6$ following, which have the same functions as the transistors $T_1$ to $T_3$. The collector of $T_6$ is connected to a flipflop in the input of the storage circuit. Diodes $D_1$ and $D_2$ are provided in the two amplifiers. These diodes are constituted in an integrated circuit technique, for example, by transistors whose collector electrodes are suitably connected to the emitters. The diodes $D_1$, $D_2$ ensure that two current generators $St_1$ and $St_2$ cannot reach the bottomed state. A mutual influence of these current generators, which can be jointly controlled in an IC, is then obviated. A further advantage of this circuit arrangement is that the current generators $St_1$ and $St_2$ in the rest condition give the base electrodes of the transistors $T_1$ and $T_4$ an extra bias with the forward voltage $U_D$ of the diodes $D_1$ and $D_2$. Interfering pulses must then surpass a threshold voltage which is the sum of $U_{BE}$ of the transistors $T_1$ and $T_4$ and of $U_D$. In addition the blocking delay charge of the diodes $D_1$ and $D_2$ is to be overcome by possible interference pulses.

The inputs of the touch-control amplifiers are connected through a pre-arranged resistor $R_1$ of, for example, 10 Kohm and a safety resistor $R_2$ in accordance with the VDE prescriptions to an electrode $E_1$ of a touch contact, while a counter electrode $E_2$ of this touch contact is likewise connected to a common reference point via a safety resistor $R_3$ which can be jointly provided for all electrodes $E_2$ in this case. This common reference point is denoted by M (ground).

The touch-control amplifier is suitable for a high input sensitivity, for example, less than 0.1 $\mu A$ and furthermore current generators $St_1$ and $St_2$ having a nominal current of, for example, 0.3 $\mu A$ are connected to each touch-control amplifier input, hence to the transistors $T_1$ and $T_4$, respectively. The input sensitivity is then 0.4 $\mu A$ including tolerances of the current generator and at a supply voltage of +13V it provides a required fingertip-controlled resistance for connecting the electrodes $E_1$ to $E_2$ of 32.5 MOhm (excluding the resistors $R_1$ and $R_2$).

The drawing shows as an example an embodiment of a current generator, namely a lateral pnp transistor $T_7$ having a number of collector electrodes in a circuit arrangement with a second transistor $T_8$ as a current mirror with a current reduction of 10:1. Tolerances in this current reduction are actually only dependent on the tolerances in the dimensions of the integrated structural elements. However, also after addition of the extra tolerances for obtaining a current of 3 $\mu A$ they are considerably lower than the input sensitivity tolerances without using the current generator. The connections denoted by 1 and 2 thus lead to the terminals 1 and 2, as is shown in the total electrical circuit diagram, i.e. to the touch-control amplifier inputs, while the impressed current of 3 $\mu A$ at 3 is provided by a reference current source. The diode $D_1$ is not always absolutely necessary. The current source $St_1$ is overdriven in case of a too large touch resistance between $E_1$ and $E_2$ when the diode $D_1$ is absent, so that the current provided by the current source is automatically limited.

Figure 2:
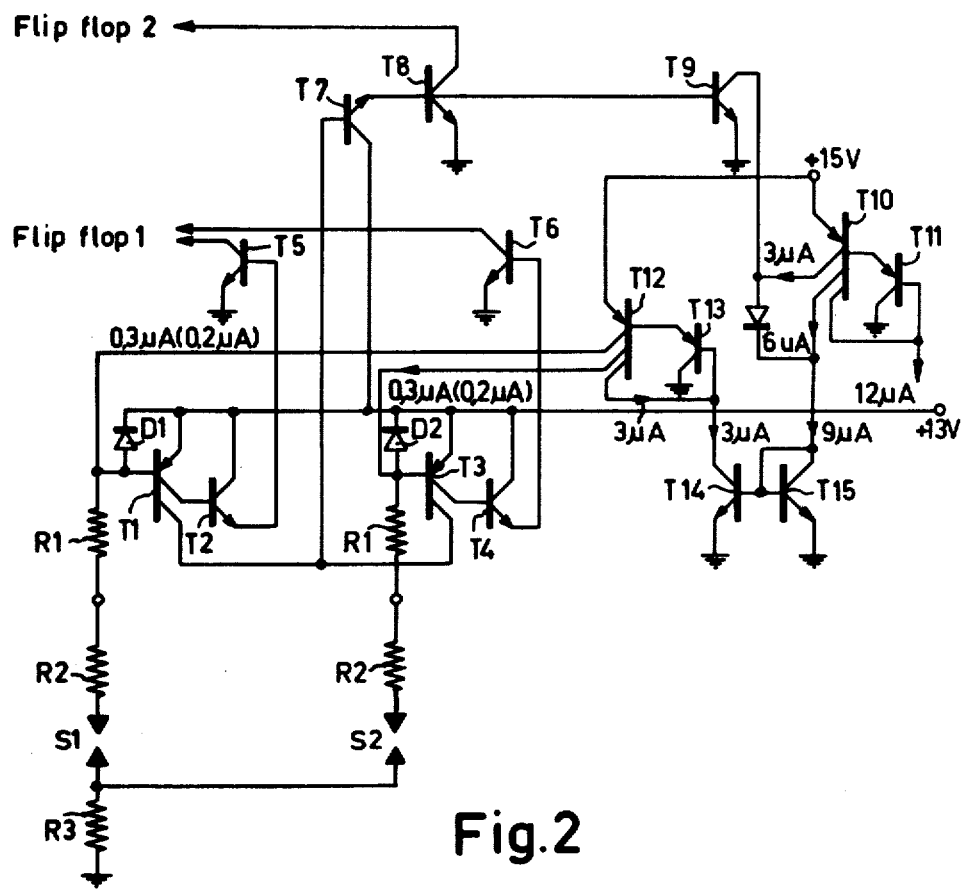
FIG. 2 shows a further embodiment of a circuit arrangement according to FIG. 1 including a feedback.

FIG. 2 shows part of an IC circuit and is an embodiment which yields a very reliable switching operation. The use of transistors with a number of collector electrodes is only possible when using pnp transistors. When an inverse circuit arrangement is used, transistors with a number of collector electrodes must each be replaced by a number of separate transistors and in addition the emitter and base electrodes must have a different conductance, i.e. also the switching transistors must be pnp transistors instead of npn transistors.

The contact surfaces are denoted by $S_1$ and $S_2$. They are connected to the inputs of the subsequently arranged amplifiers through the VDE safety resistors $R_2$ and to the common reference point through the VDE safety resistor $R_3$. The resistors $R_1$ are resistors before the inputs of the amplifiers and may have a value of, for example, 10 Kohms The diodes $D_1$ and $D_2$ may alternatively be transistors arranged in a corresponding manner, for example, as is common practice in the integrated circuit technique, the collector electrodes may be connected to the emitter electrodes in a corresponding manner. The amplifiers consist of the transistors $T_1$ and $T_2$, and $T_3$ and $T_4$. These transistors are followed by the transistors $T_5$ and $T_6$ at the inputs of a flipflop 1. Suppose that the touch contact $S_1$ is gently touched. A current of 0.3 µA then passes through it plus a base current from $T_1$ which may be approximately 0.05 µA. The two currents combined produce the total fingertip-controlled current i.e. the current of, for example, 0.35 µA passing through the electrodes of the contact surface $S_1$. Furthermore the input of $T_9$ is more sensitive than the inputs of $T_8$ and $T_5$, i.e. the transistor $T_9$ is pre-arranged relative to the transistors $T_5$, $T_6$ and $T_8$. When the touch contact $S_1$ is gently touched, the transistor $T_1$ becomes conducting. As a result, transistors $T_7$ and $T_9$ likewise become conducting, However, the transistors $T_5$ and $T_8$ do not become conducting in such a manner that the flipflop 1 and a control flipflop 2 change over (due to the gentle touch). Since the transistor $T_9$ is conducting, a current of 3 µA is passed from the transistor $T_{10}$ via the transistor $T_9$ relative to the common reference point, hence ground so that only a current of 6 µA instead of 9 µA flows in the transistor $T_{15}$. Transistors $T_{15}$ and $T_{14}$ constitute a current mirror for, for example, a reduction ratio of 3:1 so that the transistor $T_{14}$ only draws a current of 2 µA instead of 3 µA, and through the current mirror comprising the transistors $T_{12}$ and $T_{13}$ a current of only 0.2 µA flows from the transistor $T_{12}$ in the two collector electrodes connected to the inputs and the base electrodes of the transistors $T_1$ and $T_3$, respectively, (instead of the previous 0.3 µA). A value of 0.2 µA is subtracted from the current of 0.35 µA at the input of the amplifier shown on the left-hand side of the Figure, which currents still flow as "fingertip-controlled currents" so that 0.15 µA flows in the base of the transistor $T_1$ instead of, as stated above, only 0.05 µA. As a result the transistor $T_1$ suddenly conveys a much higher collector current which is sufficient to render the transistors $T_2$, $T_5$ and $T_8$ conducting in such a manner that the two flipflops 1 and 2 change over. This is, however, effected independently of the fact whether the touch contact $S_1$ is gently or less gently touched, for this gentle touch already leads within an extremely short time to the said switching operations so that a less gentle finger-tip touch later on is unimportant for the further switching functions.

Said 0.2 µA thus flows to the inputs instead of the original 0.3 µA so that the consequence of the fingertip touch is supported. The difference of 0.1 µA then flows extra in the input transistor of the touch-control amplifier. This feedback effect is such that at substantially each touch of a touch control all desired and required control operations are performed.

When using such a current hysteresis circuit as a switch, which is to switch of the sound section or possibly the AVC section in a receiver, it is also found that a hum current possibly caused through the touch controls, hence through the fingers upon touching, does not appear or only appears in case of an extremely strong hum coupling at the output of such a switch.

The following may be noted to explain the principle described with reference to FIG. 1. When $V_{ref}$ = the voltage between an electrode of a touch contact and the emitter of the input transistor of the amplifier, $I_s$ = the current through the output transistor of the amplifier at which it is completely saturated, $\alpha$ = the total current amplification of the amplifier, $I$ = the current provided by the current source flowing to the junction of the other electrode of the touch contact and the base of the input transistor $R$ = the resistance between the electrodes of the touch control, then there applies that when the output transistor of the amplifier is just bottomed upon touching a touch contact in the circuit arrangement of FIG. 1 and the base current of the input transistor thus is $I_s/\alpha$:

$$I + \frac{I_s}{\alpha} = \frac{V_{ref}}{R}$$

$$R = \frac{V_{ref}}{I + \frac{I_s}{\alpha}}$$

This shows that the current amplification no longer has any influence when $$\alpha >> \frac{I_s}{I} \text{ or } \alpha >> \frac{I_s R}{V_{ref}}.$$

What is claimed is:

1. A touch control circuit arrangement comprising a touch contact having two electrodes, an amplifier having an input coupled to one of said electrodes, a constant current source coupled to said one electrode, and a voltage source coupled to the remaining electrode.

2. A touch circuit as claimed in claim 1 wherein said current source comprises a transistor having a collector coupled to said one electrode and an emitter means for receiving a voltage.

3. A touch circuit as claimed in claim 2 comprising a plurality of touch contacts each having two electrodes, a plurality of amplifiers each having an input coupled to one of said electrodes respectively, a plurality of current sources coupled to said one electrodes respectively, said plurality of current sources comprising said transistor, said transistor having a plurality of collector electrodes, and a diode means for preventing overdrive upon a large contact resistance coupled between said collectors and a voltage source.

4. A touch contact surface as claimed in claim 1 wherein said amplifier comprises an output, and further comprising feedback means coupled between said output and said current source for reducing the current supplied by said source upon touching of said touch contact.

* * * * *